US011145507B2

(12) United States Patent
Chiao et al.

(10) Patent No.: US 11,145,507 B2
(45) Date of Patent: Oct. 12, 2021

(54) METHOD OF FORMING GALLIUM NITRIDE FILM OVER SOI SUBSTRATE

(71) Applicant: WAFER WORKS CORPORATION, Taoyuan (TW)

(72) Inventors: Ping-Hai Chiao, Taoyuan (TW); Wen-Chung Li, Taoyuan (TW); Tsui-Yun Liao, Taoyuan (TW)

(73) Assignee: WAFER WORKS CORPORATION, Taoyuan (TW)

( * ) Notice: Subject to any disclaimer, the term of this patent is extended or adjusted under 35 U.S.C. 154(b) by 92 days.

(21) Appl. No.: 16/714,810

(22) Filed: Dec. 16, 2019

(65) Prior Publication Data
US 2021/0183652 A1 Jun. 17, 2021

(51) Int. Cl.
*H01L 21/02* (2006.01)
*H01L 21/308* (2006.01)

(52) U.S. Cl.
CPC ...... *H01L 21/0254* (2013.01); *H01L 21/0245* (2013.01); *H01L 21/02516* (2013.01); *H01L 21/02647* (2013.01); *H01L 21/3081* (2013.01)

(58) Field of Classification Search
CPC ........... H01L 21/02647; H01L 21/0245; H01L 21/02516; H01L 21/0254; H01L 21/3081; H01L 21/7624–76291; H01L 27/1203–1211; H01L 21/02538–02549; C23C 14/0617; C23C 16/301–303; C01B 21/0632
See application file for complete search history.

(56) References Cited

U.S. PATENT DOCUMENTS

| | | | |
|---|---|---|---|
| 6,596,377 B1* | 7/2003 | Hersee | C30B 25/02 428/195.1 |
| 8,313,967 B1* | 11/2012 | Lee | H01L 29/045 438/44 |
| 8,709,921 B2 | 4/2014 | Su | |
| 9,275,857 B1* | 3/2016 | Hersee | H01L 21/02609 |
| 9,793,389 B1* | 10/2017 | Chern | H01L 29/2003 |

(Continued)

FOREIGN PATENT DOCUMENTS

TW   I582825 B   5/2017

OTHER PUBLICATIONS

Chen Long et al., "Growth and fabrication of semi-polar InGaN/GaN multi-quantum well light-emitting diodes on microstructured Si (001) subsliates", Chinese Physics B, vol. 24, No. 11, Published Oct. 12, 2015.

*Primary Examiner* — Scott B Geyer
(74) *Attorney, Agent, or Firm* — CKC & Partners Co., LLC

(57) ABSTRACT

A method of forming a GaN film includes following steps. A silicon-on-insulator (SOI) substrate is provided. The SOI substrate includes a substrate, an insulator layer and a silicon layer. The insulator layer is disposed on the substrate and the silicon layer is disposed on the insulator layer. The silicon layer is pattered into a patterned silicon layer including a plurality of recessed features. Each recessed feature has a sidewall. A plurality of GaN structures are epitaxially grown from the sidewalls, and the GaN structures are separated from each other. The GaN structures are continuously epitaxially grown vertically and horizontally to merge the GaN structures over top of the patterned silicon layer to form a GaN layer.

12 Claims, 5 Drawing Sheets

(56) References Cited

U.S. PATENT DOCUMENTS

| | | | | |
|---|---|---|---|---|
| 2004/0029365 | A1* | 2/2004 | Linthicum | H01L 21/02447 |
| | | | | 438/481 |
| 2008/0093622 | A1* | 4/2008 | Li | H01L 21/02381 |
| | | | | 257/103 |
| 2011/0045658 | A1* | 2/2011 | Liu | C30B 25/183 |
| | | | | 438/478 |
| 2011/0227198 | A1* | 9/2011 | Wunderer | C30B 25/186 |
| | | | | 257/615 |
| 2013/0313567 | A1* | 11/2013 | Furuya | H01L 29/2003 |
| | | | | 257/76 |
| 2014/0131724 | A1* | 5/2014 | Bayram | H01L 21/0262 |
| | | | | 257/76 |
| 2016/0056244 | A1* | 2/2016 | Dasgupta | H01L 21/30608 |
| | | | | 257/183 |
| 2016/0093492 | A1* | 3/2016 | Lee | H01L 21/02639 |
| | | | | 438/492 |
| 2017/0033186 | A1* | 2/2017 | Han | H01L 21/02433 |
| 2019/0157069 | A1* | 5/2019 | Song | H01L 33/0075 |
| 2019/0273139 | A1* | 9/2019 | Horikiri | H01L 21/02491 |

* cited by examiner

METHOD OF FORMING GALLIUM NITRIDE FILM OVER SOI SUBSTRATE

BACKGROUND

Semiconductor devices in general include multiple layers of conductive, insulating, and semiconductor layers. Often, the desirable properties of such layers improve with the crystallinity of the layer. For example, the electron mobility and electron lifetime of semiconductor layers improve as the crystallinity of the layer increases. Similarly, the free electron concentration of conductive layers and the electron charge displacement and electron energy recoverability of insulative or dielectric films improve as the crystallinity of these layers increases.

For past decade, attempts have been made to grow various monolithic films on a foreign substrate such as silicon. To achieve optimal characteristics of the various monolithic layers, a monocrystalline film of high crystalline quality is desired. Attempts have been made, for instance, to grow various monocrystalline layers on a substrate such as silicon, germanium and various insulators. These attempts currently face challenges, such as dislocation or cracking of the grown crystal, which have caused the obtained monocrystalline layer to be of low crystalline quality.

SUMMARY

The present disclosure provides a method of forming a gallium nitride (GaN) film. The method includes the steps described below. A silicon-on-insulator (SOI) substrate is provided. The SOI substrate includes a substrate, an insulator layer and a silicon layer. The insulator layer is disposed on the substrate and the silicon layer is disposed on the insulator layer. The silicon layer is patterned to form a patterned silicon layer including a plurality of recessed features. Each recessed feature has a sidewall. A plurality of GaN structures are epitaxially grown from the sidewalls, and the GaN structures are separated from each other. The GaN structures are continuously epitaxially grown vertically and horizontally to merge the GaN structures over top of the patterned silicon layer to form a GaN layer.

In some embodiments, patterning the silicon layer into the patterned silicon layer includes forming a patterned mask layer on the silicon layer and etching a portion of the silicon layer not covered by the patterned mask layer using a wet etching process.

In some embodiments, etching the portion of the silicon layer not covered by the patterned mask layer includes applying a wet etchant on the silicon layer.

In some embodiments, the wet etchant includes NaOH aqueous solution.

In some embodiments, a concentration of the NaOH aqueous solution ranges from about 15 wt % to about 50 wt %.

In some embodiments, the NaOH aqueous solution is at a temperature from about 40° C. to about 80° C.

In some embodiments, a roughness average (Ra) of the sidewalls ranges from about 0.60 μm to about 0.9 μm.

In some embodiments, the patterned mask layer is substantially made of silicon oxide.

In some embodiments, the GaN structures are semi-polar GaN structures.

In some embodiments, a crystal orientation of the silicon layer is <100>.

In some embodiments, the method further includes forming semiconductor devices over the GaN layer, in which the semiconductor devices includes silicon.

In some embodiments, the sidewalls include silicon (111) facets.

In some embodiments, the recessed features are in shape of slots, and a width of each slot ranges from about 300 nm to about 500 nm.

In some embodiments, the recessed features are in shape of slots, and a pitch of the slots ranges from about 200 nm to about 300 nm.

In some embodiments, a thickness of the silicon layer ranges from about 0.3 μm to about 1 μm.

In some embodiments, the recessed features include a shape selected from the group consisting of a square shape, a triangle shape and a polygons shape.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
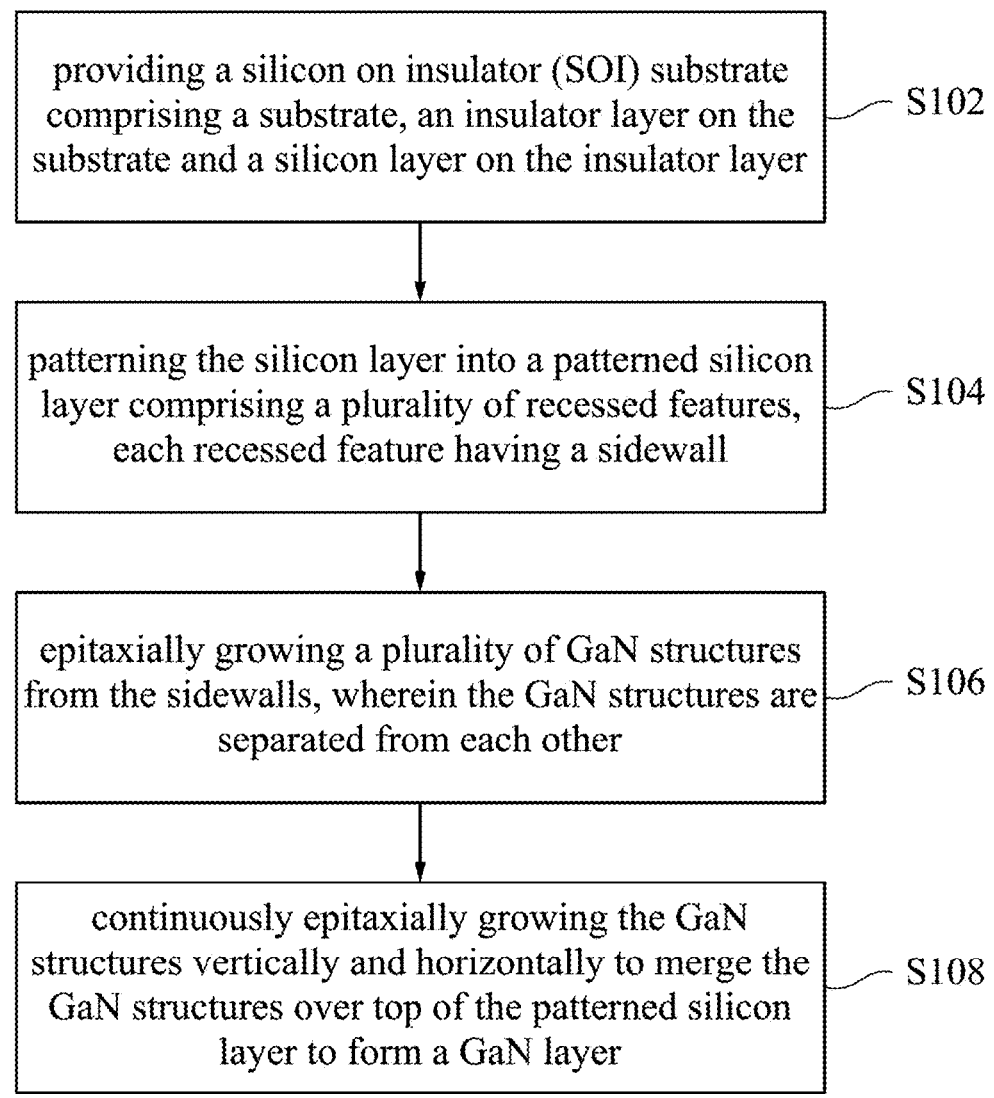
FIG. 1 is a flow chart of a method of forming a GaN film according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "bottom," "above," "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

Disclosed embodiments relate to a method of forming a semi-polar GaN film with reduced dislocation over a silicon-on-insulator (SOI) substrate. On the other hand, the methods of the presented disclosure provide a cracking free GaN film, or the defect of GaN film can be further mitigated during the epitaxial growth of GaN film. The large area and semi-polar GaN film grown over the SOI substrate can be further used or embedded into multiple semiconductor devices or integrated circuits.

Embodiments of the present disclosure offer advantages over the existing art, though it is understood that other embodiments may offer different advantages, not all advantages are necessarily discussed herein, and no particular advantage is required for all embodiments.

Figure 2:
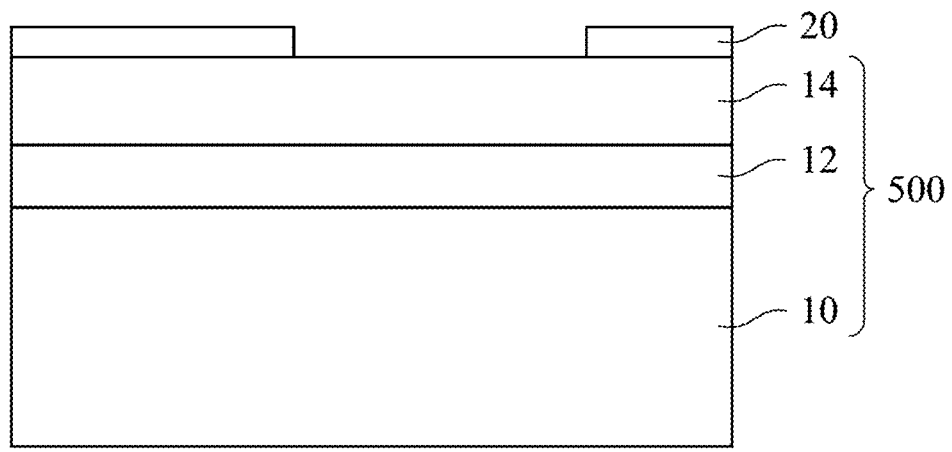
FIGS. 2, 3 and 5 are cross-sectional views schematically illustrating various stages of method for forming a GaN film, according to one or more aspects of the present disclosure.
Figure 3:
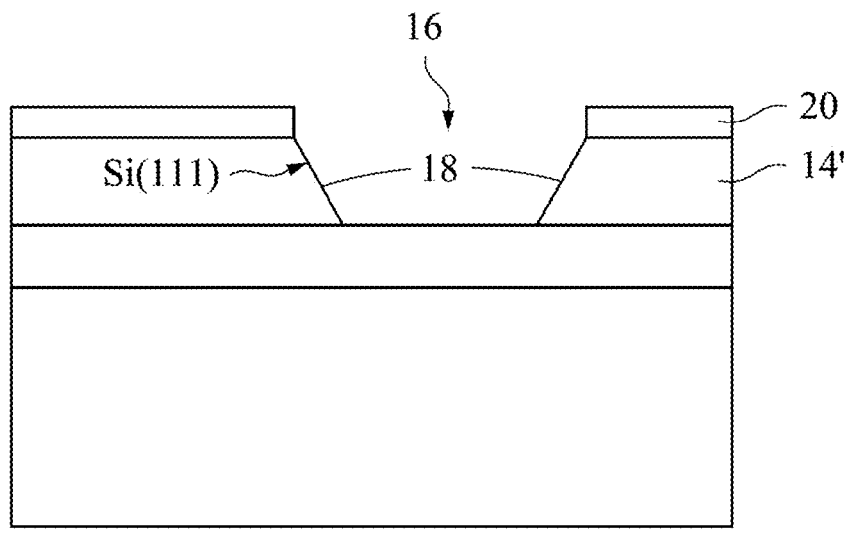

FIG. 1 is a flow chart illustrating a method of forming a GaN film over a SOI substrate according to one or more aspects of the present disclosure. The method M100 includes operation S102, operation S104, operation S106 and operation S108. FIGS. 2 and 3 are cross-sectional views schematically illustrating various process stages of method M100 in FIG. 1 according to some embodiments of the present disclosure.

Referring to FIG. 1 and FIG. 2, method 100 begins at operation S102 by providing or receiving a silicon-on-insulator (SOI) substrate 500. The SOI substrate 500 includes a substrate 10, an insulator layer 12 and a silicon layer 14. The insulator layer 12 is disposed on the substrate 10 and a silicon layer 14 is disposed on the insulator layer 12.

In some embodiments, the substrate 10 is substantially made of silicon. As an example, the insulator layer 12 is substantially made of silicon oxide. In other embodiments, the silicon layer 14 has a crystallization of silicon <100>.

The thickness of each layer of the SOI substrate can be varied based on the process requirements. For example, a thicker insulator layer is employed to reach a requirement of higher resistivity for the SOI substrate. In some embodiments, a thickness of the silicon layer 14 ranges from about 0.3 μm to about 1 μm. In other embodiments, a thickness of the insulator layer 12 ranges from about 0.1 μm to about 5 μm.

Referring to FIG. 1 and FIG. 3, the method M100 proceeds to operation S104 by patterning the silicon layer 14 into a patterned silicon layer 14' including a plurality of recessed features 16. FIG. 2 illustrates one of the recessed features 16 and others are not shown for simplicity. Each recessed feature 16 has sidewalls 18.

In some embodiments, operation S104 may include forming a patterned mask layer 20 on the silicon layer 14, as shown in FIG. 2. The patterned mask layer 20 may be a hard mask, which is used to pattern the silicon layer 14 into the patterned silicon layer 14' in FIG. 3. In examples, the patterned mask layer 20 is formed by lithography and etching processes. For instance, a patterned photoresist layer (not shown in FIG. 2) is formed over an unpatterned mask layer, and then the unpatterned mask layer is selectively etched, using the patterned photoresist layer as a masking layer, so to form the patterned mask layer 20 shown in FIG. 2. The patterned mask layer 20 can be any suitable materials that can protect the silicon layer 14 from the etchants. In one embodiment, the patterned mask layer 20 is substantially made of insulation materials. In example, the patterned mask layer 20 is substantially made of silicon oxide.

Thereafter, a wet etching process is employed to selectively etch the silicon layer 14 into the patterned silicon layer 14' having the recessed features 16. The recessed features 16 have Si (111) facets (i.e. sidewalls 18). Specifically, the wet etching process is a so-called "faceting etch", which is self-limiting. The faceting wet etch has sufficient chemical strength to etch the less dense (100) plane, but has relatively weaker chemical strength to etch the higher density (111) plane. Thus, the wet etchant etch stops on contiguous (111) plane, thereby the recessed features 16 each having sidewalls 18 defined by (111) planes, as illustrated in FIG. 3.

In some embodiment, the wet etching process use NaOH aqueous solution as an etchant. It is noted that the etchant including NaOH aqueous solution provides an unexpected and surprising result according to some embodiments. In specifics, the sidewalls 18 etched by NaOH show a relatively smaller roughness average (Ra). That is, the sidewalls 18 etched by NaOH are relatively flatter, which facilitates to grow epitaxial structures with less dislocation. In some embodiments, the sidewalls 18 etched by NaOH has a roughness average (Ra) ranged from about 0.6 μm to about 0.9 μm (measured by AFM). When providing a flatter sidewall, the epitaxial structures (such as GaN structures) grown there from is advantageous in better threading dislocation density.

In some embodiments, the concentration of NaOH in the aqueous solution ranges from about 15 wt % to about 50 wt %. Preferably the concentration of the NaOH ranges from about 35 wt % to about 45 wt % in terms of the roughness of the sidewalls 18 and the etching rate. When the concentration of the NaOH is greater than a certain level (such as 50 wt %), the roughness of the sidewall is unsatisfied. To the contrary, if the concentration of the NaOH is less than a certain level (such as 15 wt %), the etching rate decreases to an unacceptable level. In examples, the concentration of NaOH in the aqueous solution is 15 wt %, 20 wt %, 25 wt %, 30 wt %, 32 wt %, 35 wt %, 37 wt %, 38 wt %, 40 wt %, 42 wt %, or 45 wt %.

In some embodiments, the NaOH aqueous solution is at a temperature from about 40° C. to about 80° C. Preferably the NaOH aqueous solution is at a temperature from about 70° C. to about 80° C. in terms of the roughness of the sidewalls 18 and the etching rate.

Figure 4B:
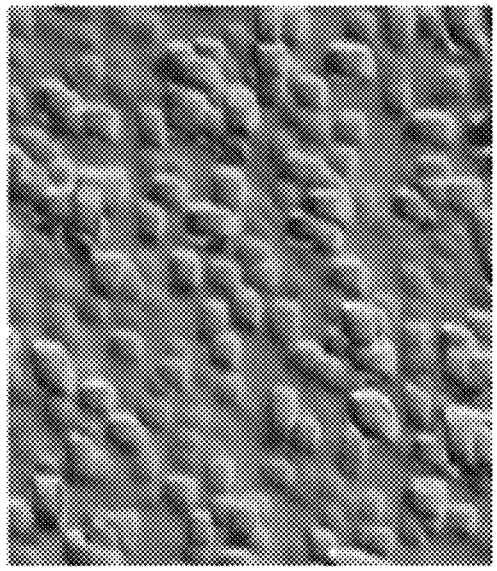
FIGS. 4A and 4B present the pictures of the sidewalls of the silicon layer taken by optical microscopes according to some embodiments of the present disclosure.
Figure 4A:
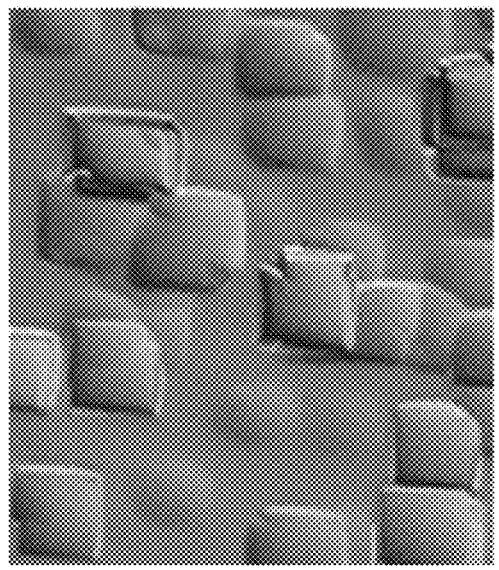

According to a comparative example, the wet etching (facet etching) process employing KOH aqueous solution shows drawbacks in view of surface roughness and flatness of the Si (111) planes. FIG. 4A is a picture showing sidewalls 18 subjected to wet etchant of KOH aqueous solution. FIG. 4B is a picture showing sidewalls 18 subjected to wet etchant of NaOH aqueous solution according to one example of the present disclosure. Both FIGS. 4A and 4B are taken under the same magnification by an identical optical microscope. In examples, the roughness average (Ra) of NaOH-etched sidewalls is about 0.76 μm while the roughness average (Ra) of KOH-etched sidewall is about 0.92 μm. The roughness average (Ra) is measured by atomic force microscopy (AFM).

Figure 5:
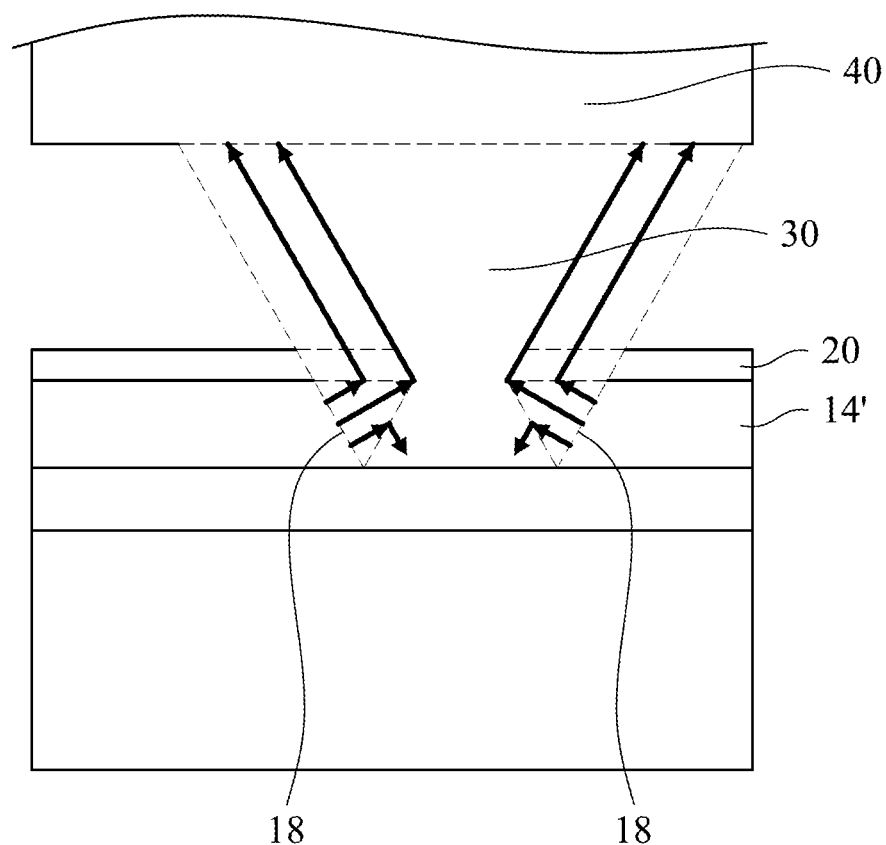

Referring to FIG. 1 and FIG. 5, method M100 proceeds to operation S106 by epitaxially growing a plurality of GaN structures 30 from the sidewalls 18. It's noted GaN structures 30 are grown from each sidewall 18 in each recessed features 16 (shown in FIG. 3). In other words, as the arrow illustrated in FIG. 5, GaN structures 30 are grown respectively from the sidewalls 18 in each recessed feature 16, thereby forming a plurality of GaN structures 30. In this stage, the GaN structures 30 are separated from each other.

It's noted that the GaN structure 30 epitaxially grown from such planes are semi-polar because of the specific orientation of silicon (111) of the sidewalls 18. The silicon (111) planes are formed by faceting etch of the silicon layer with a crystallization of silicon <100> as described hereinbefore.

In one embodiment, epitaxial growth of GaN structure 30 may be formed by a molecular beam epitaxial (MBE) process, a metalorganic chemical vapor deposition (MOCVD) process, and/or other suitable epitaxial growth processes.

Referring again to FIG. 1 and FIG. 5, method M100 proceeds to operation S108 by continuously epitaxially growing the GaN structures 30 vertically and horizontally to merge the GaN structures 30 over top of the patterned silicon layer to form a GaN layer 40.

As shown in FIG. 5, the GaN structures 30 are epitaxially grown in the area enclosed by dashed lines. More specifically, the GaN structures 30 are epitaxially grown from sidewalls 18 and subsequently reach each other in horizontal direction. The GaN structures 30 then are continuously grown vertically and exceed the opening of recessed features 16 (shown in FIG. 3). Next, the GaN structures 30 are kept growing both in horizontal and vertical, and then reaching other GaN structures 30 which are formed from the other recessed feature (not shown for simplicity). Therefore, a plurality of GaN structures 30 are merged together over the top of the patterned silicon layer 20, thereby forming a GaN film 40.

Because the GaN film 40 is epitaxially grown from GaN sidewalls 18 with a relatively smaller roughness average (Ra), the formed GaN film 40 possesses advantages of a low density of threading dislocation and an excellent uniformity in thickness.

Optionally, after operation S108, method M100 further includes an operation of forming semiconductor devices (not shown) over or on the GaN layer 40. The semiconductor devices may include semiconductor material, such as Si, Ga, In or III-V nitride. The method M100 reveals fabricating a large-area and semi-polar gallium nitride substrate useful for, not limiting to, producing optoelectronic devices (such as light emitting diodes (LEDs), laser diodes (LDs) and photodetectors) and electronic devices (such as diodes and field effect transistors (FETs)) composed of III-V nitride compounds.

Clearly, the present disclosure includes structures and methods for forming a semi-polar GaN film that can be further used for fabricating semiconductor structures, devices and integrated circuits. Further, both the distributions of recessed feature over the SOI substrate and shape of openings of recessed features play an important role in epitaxial growth of GaN film, according to some embodiments.

Figure 6C:
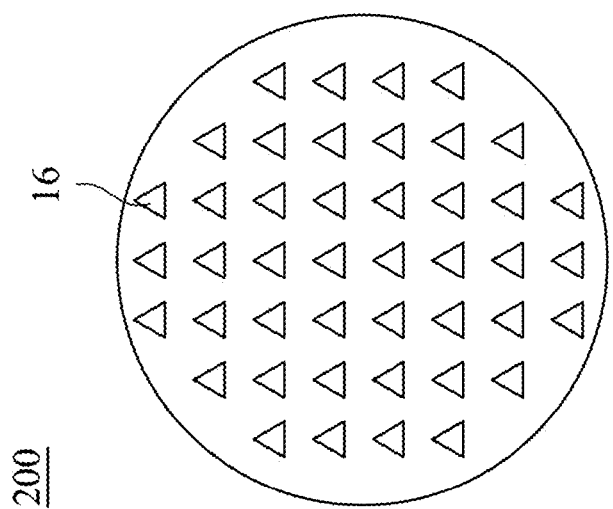
FIGS. 6A, 6B and 6C illustrate various shapes of the recessed featured according to some embodiments of the presented disclosure.
Figure 6B:
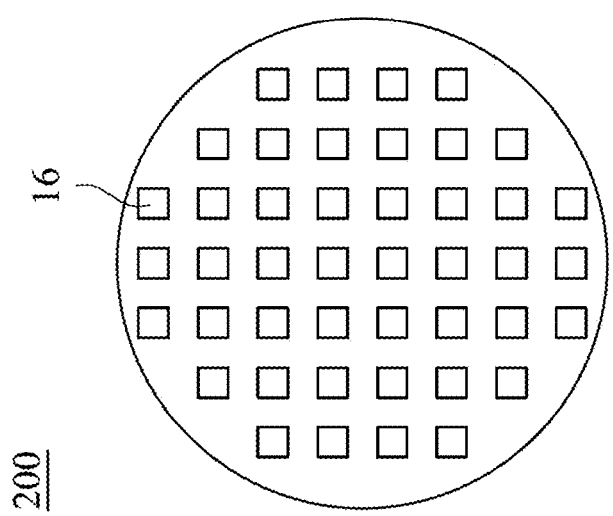
Figure 6A:
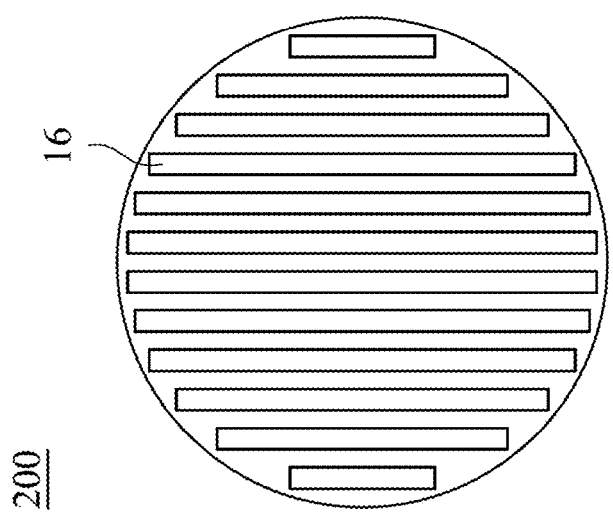

FIGS. 6A, 6B and 6C are plan views illustrating various types of shapes of the recessed featured formed in operation S104, according to some embodiments of the presented disclosure.

The SOI substrate template 200 in FIG. 3 may include various types of shapes in recessed features. As an example, the recessed features 16 are in shape of slots as illustrated in FIG. 6A. These slots are arranged in parallel and equipped with certain pitch to each other. In some embodiments, a pitch of the slots ranges from about 200 nm to about 300 nm. In other embodiments, a width of each slot ranges from about 300 nm to about 500 nm.

Alternatively, the recessed features are in square shape as illustrated in FIG. 6B. These squares can be formed by using one or more operations combining processes of lithography and etching. The features are arranged repeatedly with a width apart from each other and distributed evenly over the SOI substrate.

FIG. 6C illustrates another embodiment of shapes of the recessed features. The openings of the recessed features 16 are triangle shaped, and are arranged over the SOI substrate in a regular manner. In other embodiments, the recessed features can be in polygons shape.

It's noted that FIGS. 6A, 6B and 6C are exemplary examples and not meant to limit the shapes of the recessed features. For example, the recess features may include some square shape and some triangle shape. In some embodiments, the recessed features include a shape selected from the group consisting of a square shape, a triangle shape and a polygons shape.

Base on the above, the present disclosure provides methods of forming a semi-polar GaN film over a SOI substrate. The method employs a wet process using an etchant including NaOH. With quite simple and feasible process integration, the method M100 achieves less rough facet planes, on which GaN film are grown, resulting in reduced dislocation and cracking free of the formed GaN film.

The present disclosure provides many different embodiments of a method of forming a semi-polar GaN film. The method includes providing silicon-on-insulator (SOI) substrate. The SOI substrate includes a substrate, an insulator layer and a silicon layer. The insulator layer is disposed on the substrate and the silicon layer is disposed on the insulator layer. The method also includes patterning the silicon layer into a patterned silicon layer, and each recessed feature has sidewall. The method also includes epitaxially growing a plurality of GaN structures from the sidewalls, in which the GaN structures are separated from each other. Continuously epitaxially growing the GaN structures vertically and horizontally to merge the GaN structures over top of the patterned silicon layer to form a GaN layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of forming a GaN film, comprising:
   providing a silicon-on-insulator (SOI) substrate comprising a substrate, an insulator layer on the substrate and a silicon layer on the insulator layer;
   patterning the silicon layer into a patterned silicon layer comprising a plurality of recessed features, each recessed feature having a sidewall, wherein a process of patterning comprises:
      forming a patterned mask layer on the silicon layer; and etching a portion of the silicon layer not covered by the patterned mask layer using a wet etching process, wherein the wet etching process comprises applying a wet etchant comprising NaOH aqueous solution on the silicon layer, wherein a concentration of the NaOH aqueous solution ranges from about 15 wt % to about 50 wt %;

epitaxially growing a plurality of GaN structures from the sidewalls, wherein the GaN structures are separated from each other; and continuously epitaxially growing the GaN structures vertically and horizontally to merge the GaN structures over top of the patterned silicon layer to form a GaN layer.

2. The method of claim 1, wherein the NaOH aqueous solution is at a temperature from about 40° C. to about 80° C.

3. The method of claim 1, wherein a roughness average (Ra) of the sidewalls ranges from about 0.60 µm to about 0.9 µm.

4. The method of claim 1, wherein the patterned mask layer is substantially made of silicon oxide.

5. The method of claim 1, wherein the GaN structures are semi-polar GaN structures.

6. The method of claim 1, wherein a crystal orientation of the silicon layer is <100>.

7. The method of claim 1, further comprising:
forming semiconductor devices over the GaN layer, wherein the semiconductor devices comprise silicon.

8. The method of claim 1, wherein the sidewalls comprise silicon (111) facets.

9. The method of claim 1, wherein the recessed features are in shape of slots, and a width of each slot ranges from about 300 nm to about 500 nm.

10. The method of claim 1, wherein the recessed features are in shape of slots, and a pitch of the slots ranges from about 200 nm to about 300 nm.

11. The method of claim 1, wherein a thickness of the silicon layer ranges from about 0.3 µm to about 1 µm.

12. The method of claim 1, wherein the recessed features include a shape selected from the group consisting of a square shape, a triangle shape and a polygon shape.

* * * * *